United States Patent
Heller et al.

(10) Patent No.: US 6,731,138 B2
(45) Date of Patent: May 4, 2004

(54) CIRCUITS AND METHODS FOR SELECTIVELY LATCHING THE OUTPUT OF AN ADDER

(75) Inventors: Meiram Heller, Rishon le Zion (IL); Eitan Emanuel Rosen, Adarim (IL)

(73) Assignee: Intel Corporatioin, Santa Clara, CA (US)

( * ) Notice: Subject to any disclaimer, the term of this patent is extended or adjusted under 35 U.S.C. 154(b) by 0 days.

(21) Appl. No.: 10/210,345

(22) Filed: Jul. 31, 2002

(65) Prior Publication Data

US 2004/0021482 A1 Feb. 5, 2004

(51) Int. Cl.[7] .............................................. H03K 19/20
(52) U.S. Cl. ........................ 326/104; 326/105; 326/95; 326/98; 708/505; 708/667
(58) Field of Search ................................ 326/53, 37–41, 326/104, 105, 95, 98, 52, 54, 55; 708/505, 667

(56) References Cited

U.S. PATENT DOCUMENTS

| | | | |
|---|---|---|---|
| 5,726,586 A | * | 3/1998 | Chan et al. ................... 326/40 |
| 5,751,162 A | * | 5/1998 | Mehendale et al. ........... 326/37 |
| 6,397,241 B1 | * | 5/2002 | Glaser et al. ............... 708/625 |

* cited by examiner

*Primary Examiner*—V. Tan
(74) *Attorney, Agent, or Firm*—Grossman & Flight, LLC

(57) ABSTRACT

Methods and circuits for selectively latching the output of an adder are disclosed. One such circuit includes first and second NAND gates, each of which has an input coupled to a clock signal. The outputs of the NAND gates are coupled to a multiplexer. A set dominant latch is coupled to the clock signal and an output of the multiplexer.

28 Claims, 2 Drawing Sheets

| CLOCK | MUX | SDL |
|-------|-----|-----|
| 0 | 1 | NO CHANGE |
| 1 | 1 | 0 |
| 1 | 0 | 1 |

CIRCUITS AND METHODS FOR SELECTIVELY LATCHING THE OUTPUT OF AN ADDER

FIELD OF THE INVENTION

The invention relates generally to adders, and more particularly, to circuits and methods for selectively latching the output of an adder.

BACKGROUND OF THE INVENTION

A microprocessor typically includes an arithmetic unit. The arithmetic unit typically includes an adder. A portion 10 of such an adder is shown in FIG. 1.

The illustrated portion 10 of the adder includes first and second exclusive or (XOR) gates 12, 14. One of the XOR gates 12, 14 develops an answer with a carry 1 signal. The other of the XOR gates 12, 14 develops an answer with no carry 1 signal.

The output signals of the XOR gates 12, 14 are respectively inverted by a pair of inverters 16, 18. The outputs of the inverters are coupled to a conventional sum select multiplexer 20.

The multiplexer 20 is responsive to a select signal to output one of the input signals received from the first inverter 16 and the input signal received from the second inverter 18. The output of the multiplexer 20 is inverted by an inverter 22. The output of the inverter 22 is latched by a latch 24.

DESCRIPTION OF THE PREFERRED EXAMPLES

Figure 2:
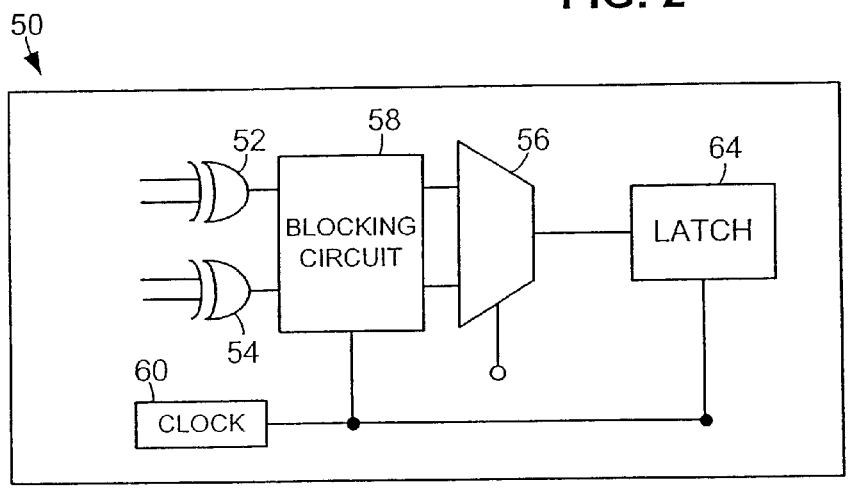
FIG. 2 is a schematic representation of an example circuit constructed in accordance with the teachings of the invention.

A circuit 50 constructed in accordance with the teachings of the invention is schematically illustrated in FIG. 2 in a preferred environment of use, namely, as an output stage of an adder. While the illustrated example shows and explains the circuit 50 in the context of that preferred environment of use, persons of ordinary skill in the art will readily appreciate that the teachings of the invention can likewise be applied in other applications and environments.

In the illustrated example environment, the adder includes first and second XOR gates 52, 54. One of the XOR gates 52, 54 outputs an answer with a carry 1 signal. The other of the XOR gates 52, 54 outputs an answer with no carry 1 signal.

The circuit 50 also includes a sum select multiplexer 56. The multiplexer 56 is responsive to a first select signal received from a control circuit (not shown) to pass one of the carry 1 signal and the no carry signal from the input of the multiplexer 56 to the output of the multiplexer 56 while blocking the other, non-selected signal as is conventional.

The multiplexer 56 is also responsive to a second select signal (which may optionally be the inverse of the first select signal) to pass the second one of the carry 1 signal and the no carry signal from the input of the multiplexer 56 to the output of the multiplexer 56 while blocking the other, non-selected input signal, again in a conventional manner.

For the purpose of selectively blocking the output signals of the XOR gates 52, 54 from the inputs of the multiplexer 56, the circuit 50 is further provided with a blocking circuit 58. As shown in FIG. 2, the blocking circuit 58 is responsive to a clock signal received from a clock 60. Specifically, when the clock signal has a first state, the blocking circuit 58 prevents the output signals of the XOR gates 52, 54 from reaching the multiplexer 56. When the clock signal has a second state, the blocking circuit 58 inverts the output signal of the XOR gates 52, 54 and passes the inverted signals to the multiplexer 56.

To selectively latch the output signals of the multiplexer 56, the circuit 50 of FIG. 2 is further provided with a latch 64. Like the blocking circuit 58, the latch 64 is responsive to the clock signal developed by the clock 60. More specifically, the latch 64 inverts the output signal of the multiplexer 56 when the clock signal has the second state (i.e., when the blocking circuit is passing the signals from the XOR gates 52, 54 to the multiplexer 56). When, however, the clock signal has the first state (i.e., when the blocking circuit is preventing the signals from the XOR gates 52, 54 from reaching the multiplexer 56), the latch 64 latches the previous output signal of the multiplexer 56.

In other words, when the clock signal has the second state (e.g., the clock signal is high), the circuit 50 performs similarly to the prior art circuit 10. Namely, it is substantially transparent to the output signal selected by the multiplexer 56. However, because as shown in FIG. 2, the latch 64 is directly coupled to the output of the multiplexer 56 (i.e., there is no intervening inverter like inverter 22 in the prior art circuit 10 in the example circuit 50 of FIG. 2), the circuit 50 propagates the selected signal from the XOR gates 52, 54 through the latch 64 more quickly than the prior art circuit 10 propagates the selected signal from the XOR gates 12, 14 through the latch 24.

Figure 3:
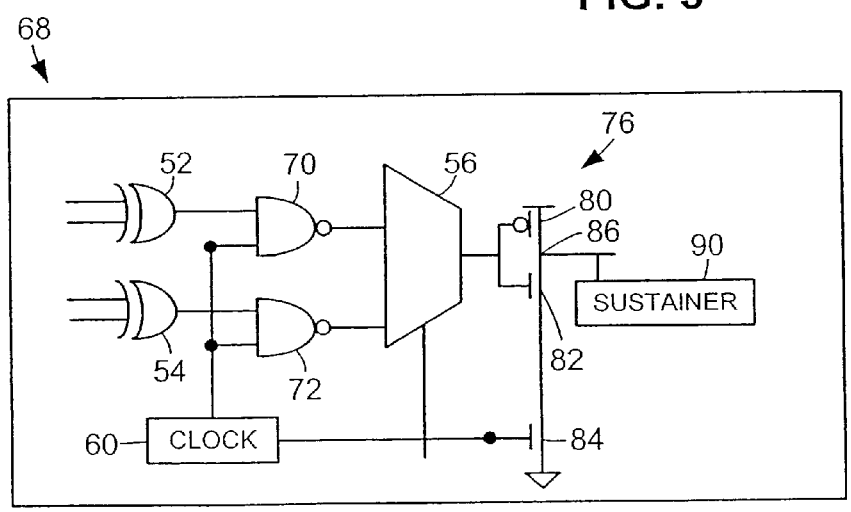
FIG. 3 is an example circuit showing one possible way to implement the circuit of FIG. 2.

One example way to implement the circuit of FIG. 2 is shown in FIG. 3. Like the circuit 50 of FIG. 2, the circuit 68 of FIG. 3 includes XOR gates 52, 54 and a sum select multiplexer 56 as discussed above. The blocking circuit 58 of the example circuit 68 shown in FIG. 3 is implemented by two NAND gates 70, 72. The outputs of the NAND gates 70, 72 are coupled to the multiplexer 56. One input of the NAND gate 70 is coupled to the output of XOR gate 52. One input of the NAND gate 72 is coupled to the output of XOR gate 54. The second inputs of each of the NAND gates 70, 72 is coupled to the clock 60. Thus, when the clock signal is low, the output signals of both NAND gates 70, 72 both become logic high regardless of the outputs of the XOR gates 52, 54. In other words, the NAND gates 70, 72 logically block the output signals of the XOR gates 50, 52 from the multiplexer 56 whenever the clock signal is low. Since the output signal of both NAND gates 70, 72 are logic high when the clock signal is low, the multiplexer 56 will always output a logic high signal when the clock signal is low. Thus, when the clock signal is logic low, the select signal has no significance (i.e., it is a "don't care").

In the example of FIG. 3, the latch 64 is implemented by a set dominant latch 76. The set dominant latch 76 is coupled directly to the output of the multiplexer 56. It is also coupled to the clock 60 to receive the clock signal. The set dominant latch 76 includes three transistors 80, 82, 84. The output signal of the multiplexer 56 is input to the P-Type transistor 80. The output signal of the multiplexer 56 is input to the N-Type transistor 82. Therefore, when the output of the multiplexer 56 is logic high, the transistor 82 turns on and the transistor 80 turns off, and vice versa.

The gate of the N-Type transistor 84 is connected to the clock. Therefore, the transistor 84 switches on and off in response to the clock signal.

Figures 4, 5:
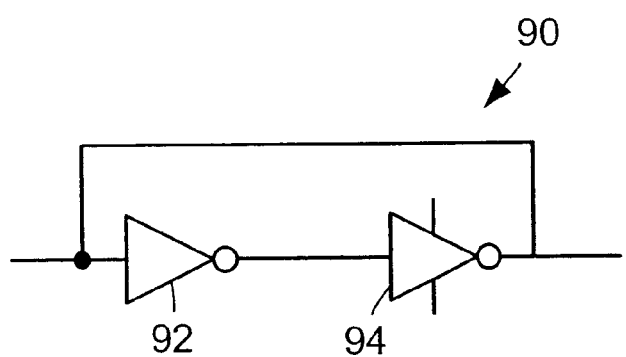
FIG. 4 is a truth table reflecting the operation of the example SDL latch of FIG. 3 in response to the output of the multiplexer and the clock signal.
FIG. 5 is a schematic illustration of an example sustainer for use in the circuit of FIG. 3.

A truth table illustrating the response of the set dominant latch 76 to the clock signal and the output of the multiplexer 56 is shown in FIG. 4. As shown in that figure, whenever the clock signal is low and the output of the multiplexer 56 is high, there will be no change in the data stored in the latch 76. There is no change because the clock signal places the transistor 84 in the off state thereby preventing discharge of any charge at the node 86, and the output of the multiplexer 56 places the transistor 80 in the off state thereby precluding charging of the node 86.

When, on the other hand, the clock is high, the latch 76 acts as an inverter of the output of the multiplexer 56 as shown in the last two rows of the truth table of FIG. 4. This occurs because, when the output signal of the multiplexer 56 is high, the transistor 82 is on. Therefore, any charge at node 86 will be drained to ground via the transistor 84 (which is turned on due to the high clock signal). When, however, the output signal of the multiplexer 56 is low, the transistor 82 is turned off (thereby separating the node 86 from ground), and the transistor 80 is turned on so that the node 86 charges to the high state.

The truth table of FIG. 4 does not reflect the situation where the clock signal is low and the output of the multiplexer 56 is low because that situation will not occur under normal operation. Specifically, as explained above, the NAND gates 70, 72 ensure that the output of the multiplexer 56 is always logic high when the clock signal is low.

Returning to FIG. 3, for the purpose of maintaining the voltage at the node 86 when the set dominant latch 76 is not demanding a change, the circuit 68 is further provided with a sustainer 90. One possible way to implement the sustainer 90 is shown in FIG. 5. As shown in that figure, the sustainer 90 includes two inverters 92, 94. The input of one of the inverters 92 is coupled to the node 86. The output of the inverter 92 is coupled to the input of the second inverter 94. The output of the second inverter 94 is connected back to the input of the first inverter 92 such that, unless a change is affirmatively driven at the node 86, the output of the inverter 94 will maintain the input of the inverter 92 without change.

Although persons of ordinary skill in the art will appreciate that the inverters 92, 94 could be implemented by any type of inverter, it is presently preferred that the first inverter 92 be implemented by a conventional inverter and the second inverter 94 be implemented by a tri-state inverter. The tri-state inverter is preferred because it makes it easier to discharge the node 86 when necessary.

Persons of ordinary skill in the art will appreciate that a set dominant latch is best used following domino logic. The NAND gates 70, 72 comprising the blocking circuit 58 simulate domino logic. Thus, the blocking circuit 58 as implemented in FIG. 3 is a domino gate simulation circuit.

Figure 1:
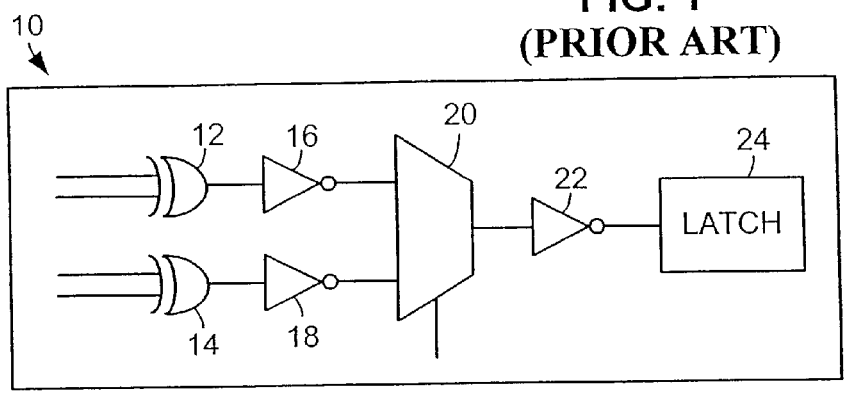
FIG. 1 is a schematic illustration of an example of a prior art circuit for use with an adder.

From the foregoing, persons of ordinary skill in the art will appreciate that the circuits illustrated in FIGS. 3–5 use less power and can operate at lower voltages than the prior art circuit of FIG. 1 because the tri-state inverter 94 requires less power and voltage to operate and because the inverter 22 of the prior art circuit has been eliminated. Persons of ordinary skill in the art will further appreciate that the circuit of FIGS. 3–5 can either be operated at higher speeds (e.g., 20 picoseconds faster) than the prior art circuit of FIG. 1 or constructed smaller than that prior art circuit.

Although certain apparatus constructed in accordance with the teachings of the invention have been described herein, the scope of coverage of this patent is not limited thereto. On the contrary, this patent covers all embodiments of the teachings of the invention fairly falling within the scope of the appended claims either literally or under the doctrine of equivalents.

What is claimed is:

1. For use with an adder, a circuit comprising:
   a first NAND gate having an input coupled to a clock signal;
   a second NAND gate having an input coupled to the clock signal;
   a multiplexer coupled to outputs of the first and second NAND gates; and
   a set dominant latch coupled to the clock signal and to an output of the multiplexer.

2. A circuit as defined in claim 1 wherein a second input of the first NAND gate is coupled to a first XOR gate and a second input of the second NAND gate is coupled to a second XOR gate.

3. A circuit as defined in claim 1 further comprising a sustainer coupled to the set dominant latch.

4. A circuit as defined in claim 3 wherein the sustainer comprises a first inverter and a second inverter, the second inverter comprising a tri-state inverter.

5. A circuit as defined in claim 1 wherein the NAND gates simulate domino logic gates.

6. A circuit as defined in claim 1 wherein the set dominant latch inverts an output signal received from the multiplexer when the clock signal is high.

7. A circuit as defined in claim 6 wherein the set dominant latch latches a prior output signal received from the multiplexer when the clock signal is low and the output signal of the multiplexer is logic high.

8. A circuit as defined in claim 7 wherein output signals of the first and second NAND gates are always logic high when the clock signal is low.

9. A circuit as defined in claim 7 wherein the output signal of the multiplexer is always logic high when the clock signal is low.

10. A method of operating a portion of an adder comprising:
    receiving a first answer with a carry 1 signal and a second answer with no carry 1 signal;
    NANDING the first answer with a clock signal to generate a first NAND output signal;
    NANDING the second answer with the clock signal to generate a second NAND output signal;
    selecting one of the first and second NAND output signals to generate a selected signal; and
    selectively latching the selected signal.

11. A method as defined in claim 10 wherein selectively latching the selected signal comprises latching the selected signal in a set dominant latch, the set dominant latch being responsive to the clock signal.

12. A method as defined in claim 10 wherein receiving the first answer and the second answer comprises receiving the first answer from a first XOR gate and receiving the second answer from a second XOR gate.

13. A method as defined in claim 10 further comprising inverting the selected signal when the clock signal is high.

14. A method as defined in claim 13 wherein selectively latching the selected signal comprises latching the selected signal when the clock signal is low.

15. For use with an adder, a circuit comprising:
 a domino gate simulation circuit responsive to a clock signal to generate first and second output signals;
 a multiplexer responsive to a select signal to output one of the first and second output signals; and
 a latch to invert the one of the first and second output signals when the clock signal has a first state, and to latch a previous output of the multiplexer when the clock signal has a second state.

16. A circuit as defined in claim 15 wherein the domino gate simulation circuit comprises first and second NAND gates.

17. A circuit as defined in claim 15 wherein the latch comprises a set dominant latch.

18. A circuit as defined in claim 15 wherein the domino gate simulation circuit is coupled to a first XOR gate and a second XOR gate.

19. A circuit as defined in claim 18 wherein the first XOR gate inputs a first answer with a carry 1 signal to the domino gate simulation circuit and the second XOR gate inputs a second answer with no carry 1 signal to the domino gate simulation circuit.

20. A circuit as defined in claim 15 further comprising a sustainer coupled to the latch.

21. A circuit as defined in claim 19 wherein the sustainer comprises a first inverter and a second inverter, the second inverter comprising a tri-state inverter.

22. For use with an adder having first and second XOR gates respectively outputting first and second output signals, and a multiplexer to select one of the first and second output signals from the first and second XOR gates, a circuit comprising:
 a blocking circuit responsive to a clock signal to block the first and second output signals when the clock signal has a first state; and
 a latch to invert the one of the first and second output signals when the clock signal has a second state.

23. A circuit as defined in claim 22 wherein the latch latches a previous one of the first and second output signals when the clock signal has the first state.

24. A circuit as defined in claim 22 further comprising a sustainer coupled to the latch.

25. For use with an adder developing first and second input signals, a circuit comprising:
 a first set of logic gates;
 a multiplexer for selecting between output signals of the first set of logic gates; and
 a set dominant latch coupled to the multiplexer without an intervening inverter.

26. A circuit as defined in claim 25 wherein the set dominant latch and the set of logic gates are responsive to a clock signal.

27. A circuit as defined in claim 25 further comprising a sustainer coupled to the latch.

28. A circuit as defined in claim 25 wherein the first set of logic gates comprise first and second NAND gates.

* * * * *